(12) United States Patent
Ogawa et al.

(10) Patent No.: US 12,451,384 B2
(45) Date of Patent: Oct. 21, 2025

(54) SUBSTRATE STORAGE CONTAINER

(71) Applicant: Shin-Etsu Polymer Co., Ltd., Tokyo (JP)

(72) Inventors: Osamu Ogawa, Saitama (JP); Seiya Nakarai, Saitama (JP)

(73) Assignee: Shin-Etsu Polymer Co., Ltd., Tokyo (JP)

(*) Notice: Subject to any disclaimer, the term of this patent is extended or adjusted under 35 U.S.C. 154(b) by 81 days.

(21) Appl. No.: 18/377,053

(22) Filed: Oct. 5, 2023

(65) Prior Publication Data

US 2024/0038561 A1 Feb. 1, 2024

Related U.S. Application Data

(63) Continuation of application No. PCT/JP2022/000405, filed on Jan. 7, 2022.

(30) Foreign Application Priority Data

Apr. 6, 2021 (JP) .................................. 2021-065011

(51) Int. Cl.
*H01L 21/673* (2006.01)

(52) U.S. Cl.
CPC .............................. *H01L 21/67383* (2013.01)

(58) Field of Classification Search
CPC ......... H01L 21/67369; H01L 21/67383; H01L 21/373; H01L 21/383
See application file for complete search history.

(56) References Cited

U.S. PATENT DOCUMENTS

| | | | | |
|---|---|---|---|---|
| 6,082,540 A | * | 7/2000 | Krampotich | H01L 21/67369 206/711 |
| 6,267,245 B1 | * | 7/2001 | Bores | H01L 21/67383 206/711 |
| 6,644,477 B2 | * | 11/2003 | Bores | H01L 21/67369 206/711 |
| 7,017,749 B2 | * | 3/2006 | Yajima | H01L 21/67369 211/41.18 |
| 7,523,830 B2 | * | 4/2009 | Burns | H01L 21/67369 206/711 |
| 7,726,490 B2 | | 6/2010 | Matsutori et al. | |

(Continued)

FOREIGN PATENT DOCUMENTS

| | | |
|---|---|---|
| JP | 2006332261 A | 12/2006 |
| JP | 2008135434 A | 6/2008 |

(Continued)

OTHER PUBLICATIONS

Office Action issued in KR10-2023-7038231 on Aug. 19, 2025.

*Primary Examiner* — Chun Hoi Cheung
(74) *Attorney, Agent, or Firm* — The Webb Law Firm (57) ABSTRACT

A substrate storage container includes a container body configured to store a substrate, a lid that closes the opening of the container body, a retainer that is attached to the lid, and a substrate support portion formed in the retainer. The substrate support portion has an arc shape in a cross-sectional view from the top-to-bottom direction perpendicular to the closing direction of the lid. The substrate support portion includes a pair of left and right substrate support portions configured to hold the substrate together with the container body to retain the substrate.

10 Claims, 10 Drawing Sheets

(56) References Cited

U.S. PATENT DOCUMENTS

| | | | | |
|---|---|---|---|---|
| 7,967,147 B2* | 6/2011 | Mimura | ............ | H01L 21/67369 |
| | | | | 414/217 |
| 8,118,169 B2* | 2/2012 | Hosoi | ................ | H01L 21/67369 |
| | | | | 206/711 |
| 8,318,275 B2* | 11/2012 | Kudo | ................ | H01L 21/67383 |
| | | | | 428/34.1 |
| 8,505,732 B2* | 8/2013 | Lu | ..................... | H01L 21/67369 |
| | | | | 206/711 |
| 8,528,738 B2* | 9/2013 | Wiseman | .......... | H01L 21/67369 |
| | | | | 206/711 |
| 11,348,815 B2 | 5/2022 | Sato | | |
| 2005/0274645 A1* | 12/2005 | Hasegawa | ......... | H01L 21/67383 |
| | | | | 257/E21.001 |
| 2009/0032433 A1* | 2/2009 | Lin | ................... | H01L 21/67369 |
| | | | | 206/711 |
| 2010/0038281 A1* | 2/2010 | Lin | ................... | H01L 21/67379 |
| | | | | 206/710 |
| 2010/0072107 A1 | 3/2010 | Mimura | | |
| 2010/0108565 A1* | 5/2010 | Lu | ..................... | H01L 21/67369 |
| | | | | 206/711 |
| 2011/0000817 A1 | 1/2011 | Hosoi et al. | | |
| 2015/0294882 A1* | 10/2015 | Matsutori | ......... | H01L 21/67383 |
| | | | | 206/723 |
| 2021/0020482 A1* | 1/2021 | Harr | ......................... | F16F 3/02 |
| 2022/0277977 A1 | 9/2022 | Kanai | | |

FOREIGN PATENT DOCUMENTS

| | | |
|---|---|---|
| JP | 2009123813 A | 6/2009 |
| JP | 2016119408 A | 6/2016 |
| JP | 2016149492 A | 8/2016 |
| JP | 2017147365 A | 8/2017 |
| JP | 202134601 A | 3/2021 |
| KR | 1020040100905 A | 12/2004 |
| KR | 1020190137779 A | 12/2019 |
| WO | 2009131016 A1 | 10/2009 |
| WO | 2014064774 A1 | 1/2014 |

* cited by examiner

SUBSTRATE STORAGE CONTAINER

CROSS-REFERENCE TO RELATED APPLICATIONS

This application is a continuation of International Patent Application No. PCT/JP2022/000405, filed Jan. 7, 2022, and claims priority to Japanese Patent Application No. 2021-065011, filed Apr. 6, 2021, the disclosures of which are hereby incorporated by reference in their entireties.

BACKGROUND OF THE DISCLOSURE

Field of the Disclosure

Embodiments described herein relate generally to a substrate storage container having a retainer that holds substrates.

Description of Related Art

A substrate storage container for storing substrates such as semiconductor wafers generally has a container body that can store a plurality of substrates and a lid that closes the opening of the container body. For example, Patent Documents 1 and 2 disclose such a substrate storage container.

The lid is equipped with a retainer for supporting substrates, and the substrate storage container holds and supports the substrates between the retainer and a support provided in the container body. The retainer has a substrate support portion which is V-shaped when viewed in cross section, and each substrate is guided to the bottom of the V-shape (see FIG. 10 of Patent Document 2).

Patent Document 1: PCT International Publication No. WO 2009/131016
Patent Document 2: Japanese Unexamined Patent Application Publication No. 2008-135434

In recent years, the types and thicknesses of substrates have become more diverse, and there are also products (stacked substrates) that are made by laminating multiple substrates. Therefore, if a container with a retainer suitable for the thickness of substrates is not used, the substrates may not be held properly. Consequently, the substrates may be rubbed, scratched, or even cracked by vibration or shock due to poor retention.

In addition, when thick substrates or the like are held by V-shaped substrate support portions, each of the substrates cannot be held evenly on the inclined surface of the V-shape at the innermost portion, and they are held in a state of being tilted with respect to the horizontal direction. As a result, a torsional force is exerted on the substrates, which may cause them to break.

SUMMARY OF THE DISCLOSURE

The present disclosure has been made to, at least to some extent, overcome the above disadvantages and to provide a substrate storage container that can stably hold substrates even if they have different thicknesses.

DESCRIPTION OF NON LIMITING EMBODIMENTS OF THE DISCLOSURE

In general, according to one embodiment, a substrate storage container comprises a container body configured to store a substrate, a lid that closes the opening of the container body, a retainer that is attached to the lid, and a pair of left and right arms formed in the retainer, each having a substrate support portion at the tip. The substrate support portion has a support surface that protrudes in an arc shape from the tip toward the container body in a cross-sectional view from the top-to-bottom direction perpendicular to the closing direction of the lid. The substrate support portion includes a pair of left and right substrate support portions configured to hold the substrate together with the container body to retain the substrate.

Hereinafter, exemplary embodiments will be described in detail with reference to the accompanying drawings. Note that like parts are designated by like reference numerals or characters throughout the description of the embodiments.

Figure 1:
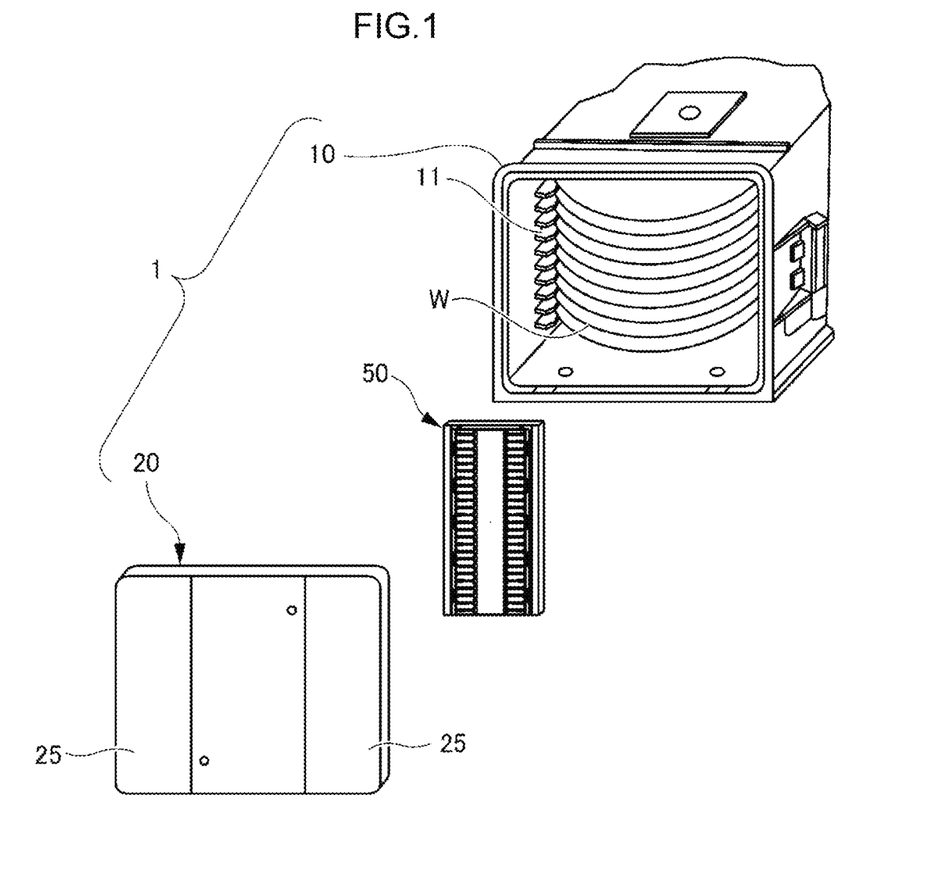
FIG. 1 is an exploded perspective view of a substrate storage container according to an embodiment.
Figure 2A:
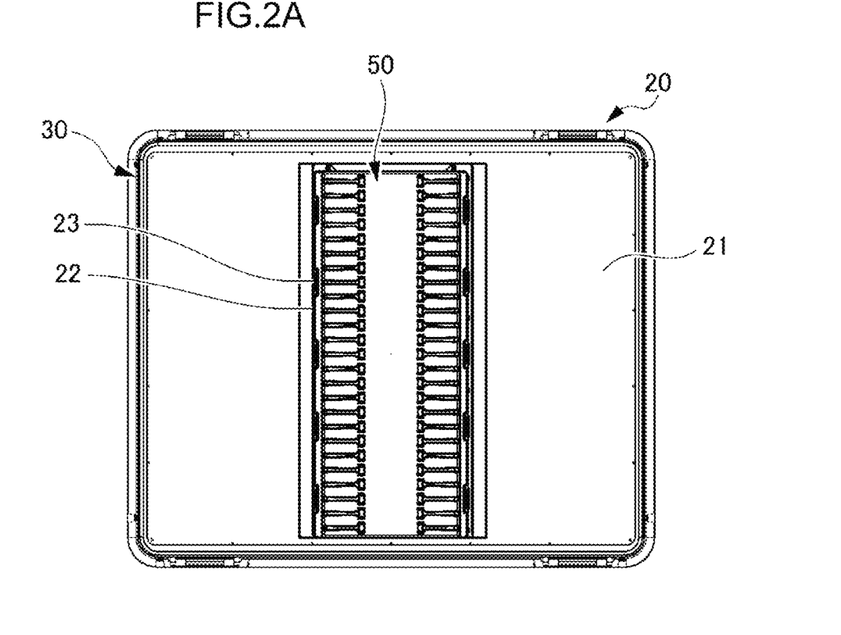
FIG. 2A is a front view of a lid and a retainer used in the substrate storage container of the embodiment.
Figure 2B:
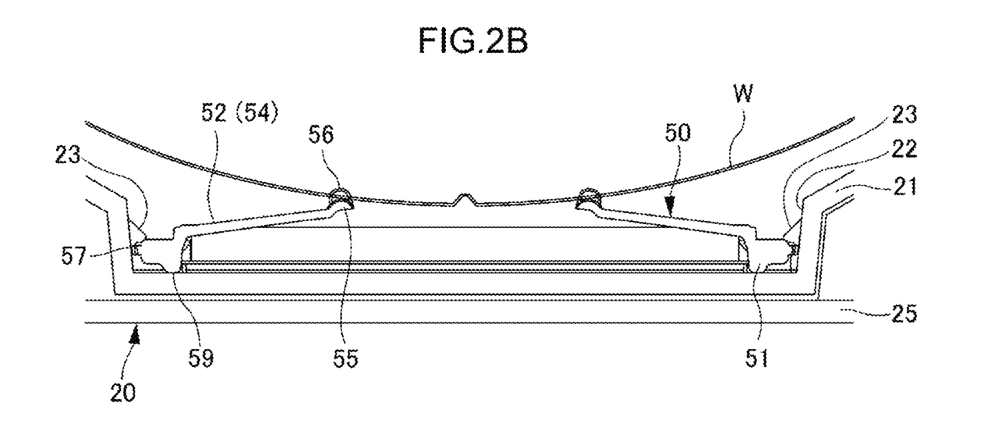
FIG. 2B is a partial cross-sectional view of the lid and the retainer used in the substrate storage container of the embodiment.

FIG. 1 is an exploded perspective view of a substrate storage container 1 according to an embodiment. FIG. 2A is a front view of a lid 20 and a retainer 50 used in the substrate storage container 1 of the embodiment. FIG. 2B is a partial cross-sectional view of the lid 20 and the retainer 50. As illustrated in FIG. 1, the substrate storage container 1 is configured to store a plurality of (e.g., 25) substrates W and includes a container body and the lid 20.

The container body 10 is in the form of a box having top, bottom, left, right and back walls and an opening in the front. In other words, the container body 10 has the shape of a front-open type box. Note that, in the following, the direction connecting the front opening and the back wall is referred to as the "front-back direction", the direction connecting the left wall and the right wall is referred to as the "left-right direction" or "horizontal direction", and the direction connecting the top wall and the bottom wall is referred to as the "top-to-bottom direction" or "vertical direction".

The container body 10 is provided with a plurality of supports 11 for supporting substrates W on the left wall and the right wall. The number of supports 11 corresponds to the maximum number of substrates W to be stored in the substrate storage container 1. The supports 11 are arranged in equal numbers on the left and right walls at equal intervals in the vertical direction so that each pair of the left and right supports 11 located at the same height position support the same substrate W. Thus, substrates W are stored horizontally in the container body 10.

Examples of the substrates W stored in the substrate storage container 1 include semiconductor wafers and mask glass substrates with a diameter of 200 mm (8 inches) or 300 mm (12 inches), which may be made of silicon, quartz, gallium/arsenic, or other materials, and which may be laminated or have various thicknesses. A notch or an orientation flat may be formed in the periphery of the substrates W.

The lid 20 is configured to close the opening of the container body 10. As illustrated in FIG. 2A, the lid 20 has a tray-shaped door body 21 and a door cover 25 (see FIG. 1) that covers the door body 21. The lid 20 is also provided with a locking mechanism (not illustrated) between the door body 21 and the door cover 25 to removably secure the lid 20 to the container body 10.

The door body 21 is recessed in the center to form a mounting recess 22 in which the retainer 50 (described later) is removably mounted and secured (see FIG. 2B). The mounting recess 22 has a plurality of (e.g., 10 in total on the left and right sides) engagement portions 23 on the left and right inner surfaces.

The door body 21 is provided with a gasket 30 to maintain the airtightness of the substrate storage container 1. Examples of materials for the gasket 30 include thermoplastic elastomers such as polyester elastomers, polyolefin elastomers, fluoroelastomers, and urethane elastomers, and elastic materials such as fluororubbers, ethylene-propylene rubbers, and silicone rubbers.

The container body 10 and the lid 20 are injection molded from a molding material. Examples of the molding material include thermoplastic resins such as polycarbonate, cycloolefin polymer, polypropylene, polyetherimide, polyetherketone, polybutylene terephthalate, polyacetal, liquid crystal polymer, and alloys thereof. An antistatic agent, a conductive additive, an ultraviolet absorber, an antioxidant, and the like may be added to the molding material as necessary.

Figure 3A:
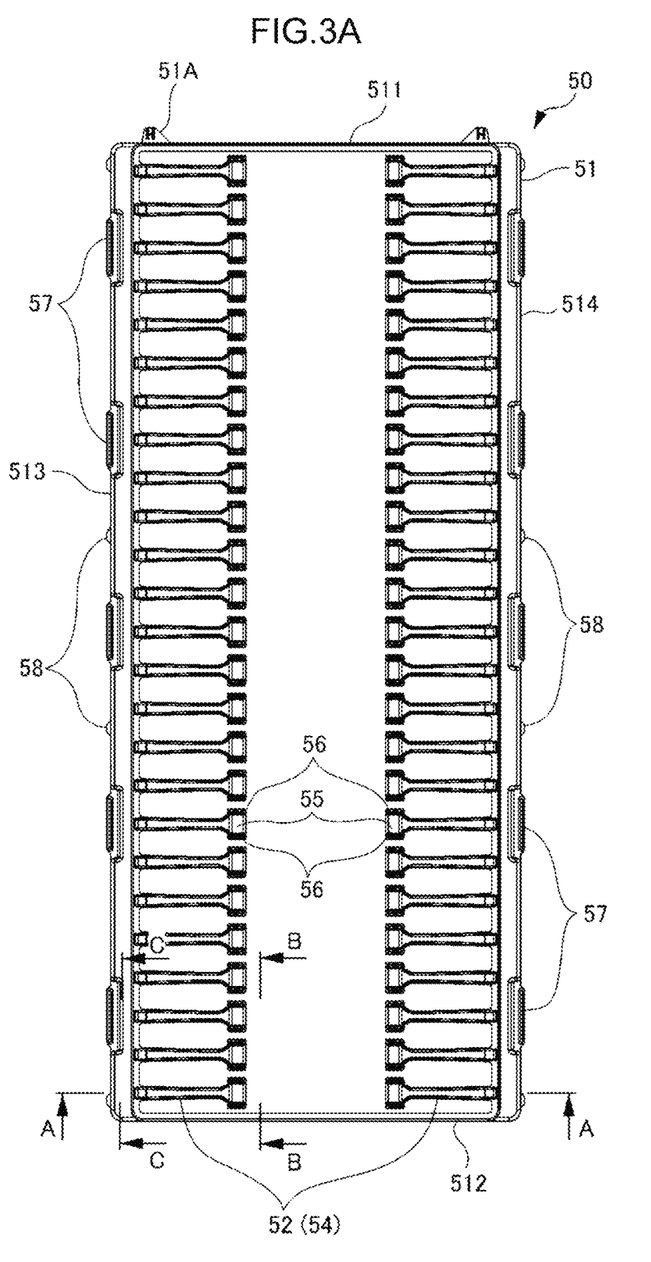
FIG. 3A is a plan view of the retainer.
Figure 3B:
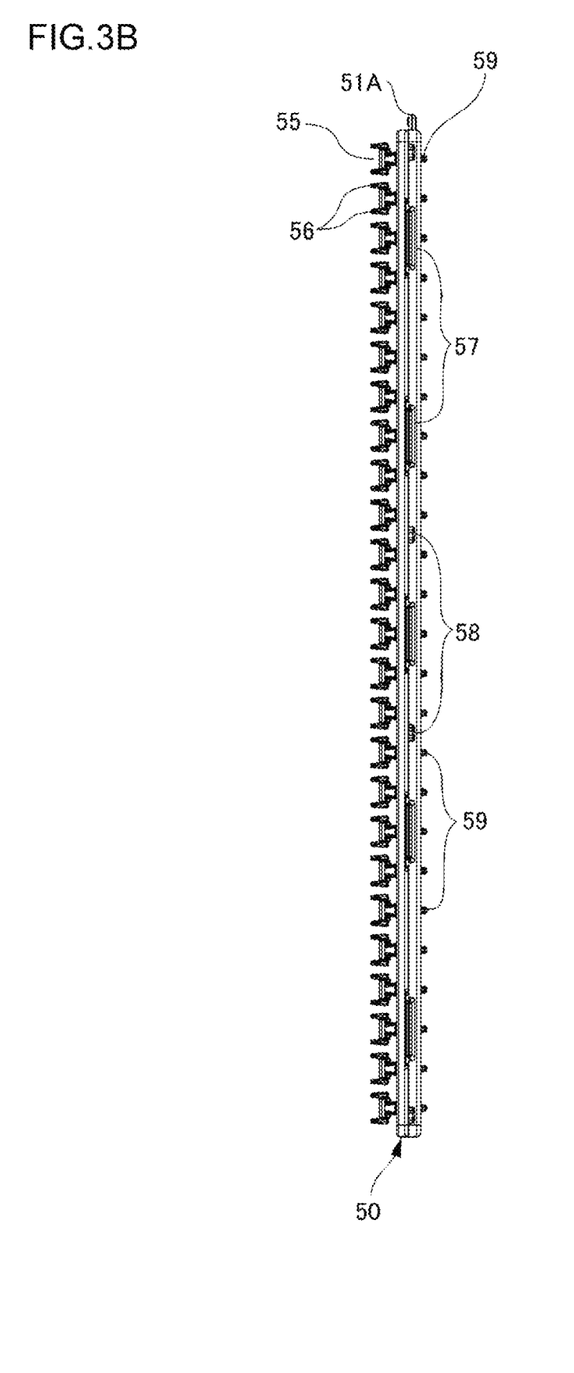
FIG. 3B is a side view of the retainer.
Figure 3C:
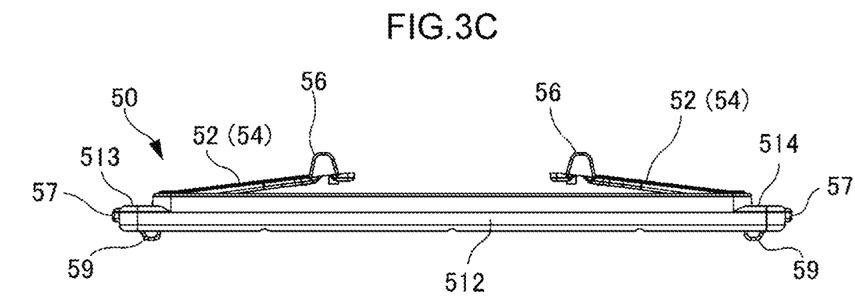
FIG. 3C is a bottom view of the retainer.
Figure 3D:
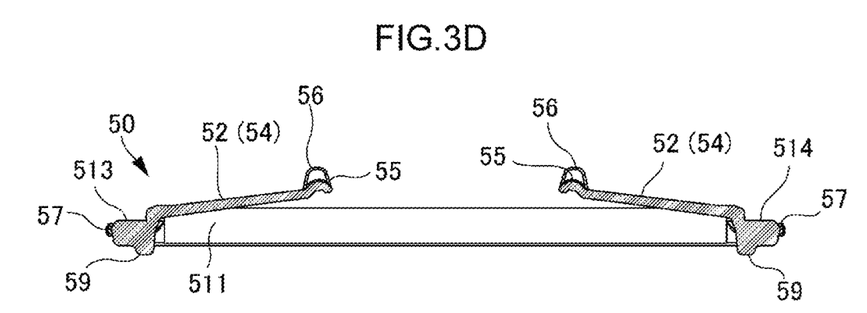
FIG. 3D is an enlarged cross-sectional view of the retainer, taken along line A-A of FIG. 3A.
Figure 3E:
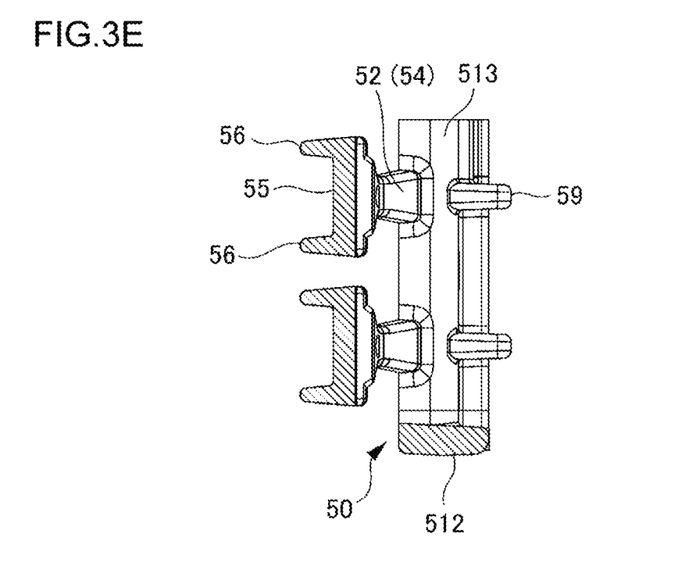
FIG. 3E is an enlarged cross-sectional view of the retainer, taken along line B-B of FIG. 3A.
Figure 3F:
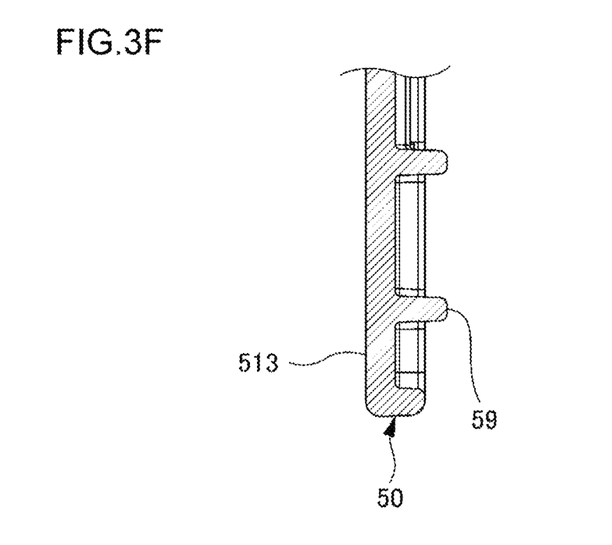
FIG. 3F is an enlarged cross-sectional view of the retainer, taken along line C-C of FIG. 3A.

Described next is the retainer 50. FIGS. 3A to 3F illustrate the retainer 50: FIG. 3A is a plan view, FIG. 3B is a side view, FIG. 3C is a bottom view, FIG. 3D is an enlarged cross-sectional view taken along line A-A of FIG. 3A, FIG. 3E is an enlarged cross-sectional view taken along line B-B of FIG. 3A, and FIG. 3F is an enlarged cross-sectional view taken along line C-C of FIG. 3A.

The retainer 50 is configured to hold the substrates W in the front-back direction together with the supports 11 of the container body 10 to retain them when the container body 10 is closed with the lid 20. As described above, the retainer 50 is removably attached to the lid 20.

As illustrated in FIG. 3A, the retainer 50 includes: a rectangular base frame 51 having an upper side 511, a lower side 512, a left side 513, and a right side 514; and pairs of left and right arms 52 extending inward from the left side 513 and the right side 514.

The base frame 51 has a plurality of (e.g., 10) engagement portions 57 on the outside of the left side 513 and the right side 514 (see FIG. 3B). The engagement portions 57 are configured to engage the engagement portions 23 of the door body 21 of the lid 20.

The base frame 51 also has a plurality of (e.g., eight) positioning protrusions 58 that protrude at least 1 mm or more on the outside of the left side 513 and the right side 514. The positioning protrusions 58 contact the inner surface of the mounting recess 22 of the lid 20 for positioning. The positioning protrusions 58 may be formed on the upper side 511 and the lower side 512 in addition to the left side 513 and the right side 514. Alternatively, the side circumference of the base frame 51 may directly contact the inner surface of the mounting recess 22 without the positioning protrusions 58.

In this manner, the retainer 50 is positioned with respect to the mounting recess 22 of the lid 20 by the positioning protrusions 58 or the side circumference of the base frame 51 and is removably secured to the lid 20 by the engagement between the engagement portions 23 and the engagement portions 57.

In addition, referring to FIG. 3B, the base frame 51 has a plurality of (e.g., 50) spacer protrusions 59 that protrude at least 1 mm or more on the back surfaces of the left side 513 and the right side 514 (the surfaces facing the door body 21 of the lid 20). Thus, the retainer 50 is lifted (spaced) from the lid by the height of the spacer protrusions 59 (see FIG. 2B).

The number of the arms 52 corresponds to the number of substrates W that can be stored in the substrate storage container 1, and each of the arms 52 is located at a height position corresponding to one of the substrates W stored in a plurality of tiers. For example, assuming that 25 substrates W are to be stored, arms are arranged at a predetermined distance on the left side and the right side. Note that since the left and right arms 52 are symmetrical, only one of them will be described below.

Each of the arms 52 includes a holding force adjustment portion 54 on a portion from the proximal end to the distal end. The holding force adjustment portion 54 enables the adjustment of the holding force for pressing and holding each substrate W. In this embodiment, the holding force adjustment portion 54 is formed in a shape that decreases in thickness from the proximal end to the distal end, i.e., the thickness is adjusted (see FIGS. 3C and 3D). The thickness of the holding force adjustment portion 54 is preferably about 0.5 mm to 1.5 mm.

It is preferable that the spring constant k of the arm 52 be set to 0.15 N/mm or more and 2.5 N/mm or less by the holding force adjustment portion 54. This allows the holding force of the arm 52 to be adjusted in the range of 0.15 N (15 gf) to 10.0 N (1020 gf). For example, for a substrate W with a diameter of 300 mm, the holding force (standard value) of the arm 52 may be set to about 3 N (294 gf) (a total holding force of 6 N with respect to each pair of the left and right arms 52). Note that the holding force of the arm 52 is assumed to be that when a substrate support portion 55 (described later) is bent by 2.5 mm from the unloaded state.

Figure 4:
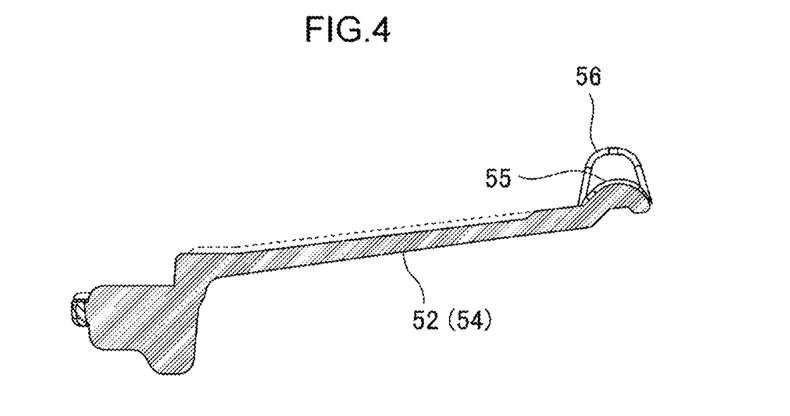
FIG. 4 is a cross-sectional view of an arm in which the thickness of a holding force adjustment portion has been changed.

A specific example will be described below in which the thickness of the holding force adjustment portion 54 is changed to be thinner. FIG. 4 is a cross-sectional view of the arm 52 in which the thickness of the holding force adjustment portion 54 has been changed. In FIG. 4, the dashed-dotted line indicates the thickness before the change, and the solid line indicates the thickness after the change.

By changing the thickness of the holding force adjustment portion 54 in this manner, the retainer 50 with standard specifications, high load specifications (low load specifications), or the like can be prepared according to the application. Incidentally, the holding force can also be changed or varied to different values by adjusting the dimensions other than the thickness (width, overall shape, etc.) of the holding force adjustment portion 54. For example, the entire arm 52 may have a shape that gradually tapers toward the tip side (the portion in front of the substrate support portion 55 described later) in a plan view such that the cross-sectional area (width×thickness) of the tip side of the arm 52 is at least 30% smaller than the cross-sectional area of its base side (the base frame 51 side). In this case, the width of the arm 52 may be about 2.5 mm to 4 mm.

While the holding force adjustment portion 54 may be varied according to the specifications of the retainer 50 such as standard specifications, high load specifications, or the like, it may also be varied for each of the arms 52 of the same retainer 50. For example, there may be variations in the dimensions of the arms 52 since the flowability of the molding material varies depending on the locations from the gate position in an injection mold for molding the retainer 50. This may result in different holding forces; however, the holding force adjustment portion 54 can be used to make the arms 52 have a uniform holding force.

If the retainer 50 is attached to the lid 20 upside down after the holding force of each of the arms 52 has been adjusted, the intended holding force may not be obtained, or the vertical contact position between a substrate W and the substrate support portion 55 may differ from the designed value (in the worst case, a substrate W may be positioned between an adjacent pair of the substrate support portions 55 and cannot be held). Therefore, in order not to confuse the top and bottom of the retainer 50, letters or symbols (e.g., "top", "T", etc.) may be stamped on the base frame 51, or the base frame 51 may be provided with one or more mis-attachment prevention protrusions 51A which make it impossible to attach the retainer 50 to the lid 20.

In order to prevent erroneous attachment of the retainer 50 with different specifications such as standard specifications, high load specifications, or the like, the mis-attachment prevention protrusions 51A may be marked with a letter or symbol (e.g., "H", "L", etc.). In the example of FIG. 3A, the triangular mis-attachment prevention protrusions 51A are marked with a letter "H" indicating high load specifications). Alternatively, another identification protrusion (not illustrated) may be provided near the mis-attachment prevention protrusions 51A with an external shape different from the external shape of the mis-attachment prevention protrusions 51A so that the specifications of the retainer 50 can be distinguished by the presence/absence or the external shape of the identification protrusion. In this case, the identification protrusion can also be referred to as the second mis-attachment prevention protrusion.

Referring back to FIGS. 3A to 3F, the arm 52 further includes the substrate support portion 55 that contacts and supports a substrate W at its tip and substrate guide portions 56 that suppress the vertical displacement of the substrate W.

The substrate support portion 55 is configured to contact the side surface (end surface) of a substrate W to support the substrate W. The substrate support portion 55 is pressed by the substrate W while in contact with the substrate W, causing the entire arm 52 to deform elastically. The substrate support portion (the support surface thereof) is formed in an arc shape (semicircular shape) in a cross-sectional view from the top-to-bottom direction perpendicular to the closing direction of the lid (see FIG. 3D). The radius of curvature of the substrate support portion 55 may be 2.0 mm or more and 4.0 mm or less.

Meanwhile, the substrate guide portions 56 are erected from the upper and lower ends of the semi-cylindrical substrate support portion 55 (see FIG. 3E) and function as a guide for regulating (preventing) the vertical displacement of a substrate W. The pair of upper and lower substrate guide portions 56 have an arc shape (semicircular shape) in a cross-sectional view from the top-to-bottom direction perpendicular to the closing direction of the lid 20, and they protrude further toward the container body 10 than the substrate support portion 55 (see FIG. 3D).

In this manner, the substrate support portion 55 and the pair of upper and lower substrate guide portions 56 form a U-shaped slot with the substrate support portion 55 as the bottom in a side view from the left or right side. Note that although depending on the number of substrates W that can be stored in the substrate storage container 1, the storage pitch, and the thickness of each substrate W, the length of the substrate support portion in the vertical direction, i.e., the distance between the substrate guide portions 56, is preferably 5 mm or more.

The retainer 50 having the above configuration may be molded from polycarbonate, cycloolefin polymer, polypropylene, polybutylene terephthalate, polyetherimide, polyethersulfone, polyetheretherketone, liquid crystal polymer, alloys thereof, thermoplastic elastomer, and the like. An antistatic agent, a conductive additive, an ultraviolet absorber, an antioxidant, and the like may be added to the molding material for forming the retainer, as with that for the container body and the lid, if necessary.

Figure 5A:
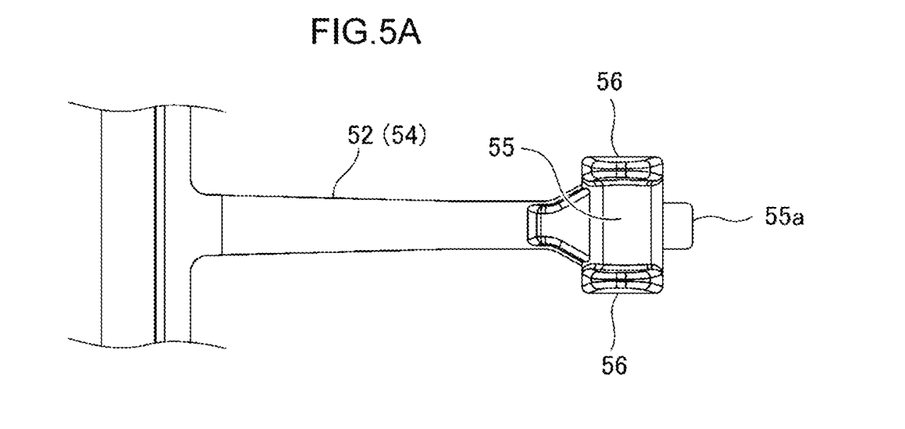
FIG. 5A is a plan view of the arm having a tongue portion at the distal end.
Figure 5B:
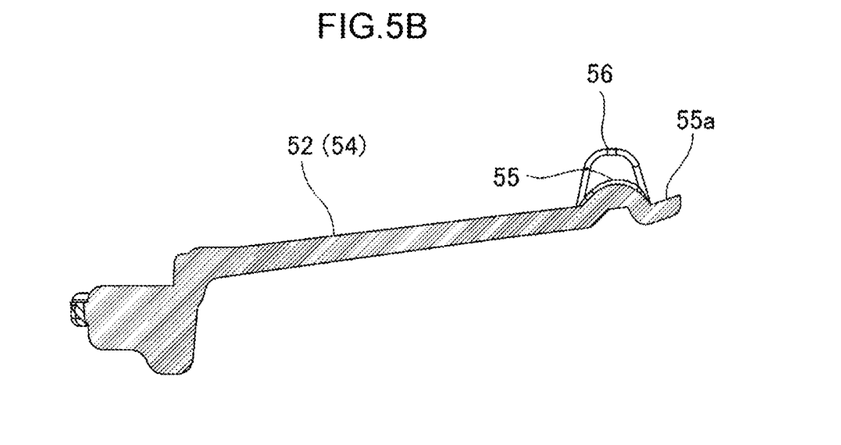
FIG. 5B is a cross-sectional view of the arm having the tongue portion at the distal end.

Since, for example, the flowability of the molding material varies depending on the locations from the gate position in an injection mold as described above, there may be cases where the shape of the semi-cylindrical substrate support portion 55 does not fit as designed (within the acceptable range), sink marks occur, or mold release failure occurs. Therefore, as illustrated in FIGS. 5A and 5B, a tongue portion 55a may be provided at the tip of the substrate support portion 55 so that the substrate support portion 55 is not at the end of the flow path, or the surface opposite to the support surface of the substrate support portion 55 may be recessed to prevent thickening, thereby ensuring and improving moldability. Incidentally, FIGS. 5A and 5B illustrate the arm 52 having the tongue portion 55a at its distal end: FIG. 5A is a plan view, and FIG. 5B is a cross-sectional view.

Described below is a state in which a substrate W is held and retained between the retainer 50 of the lid 20 and the supports 11 of the container body 10.

Figure 9A:
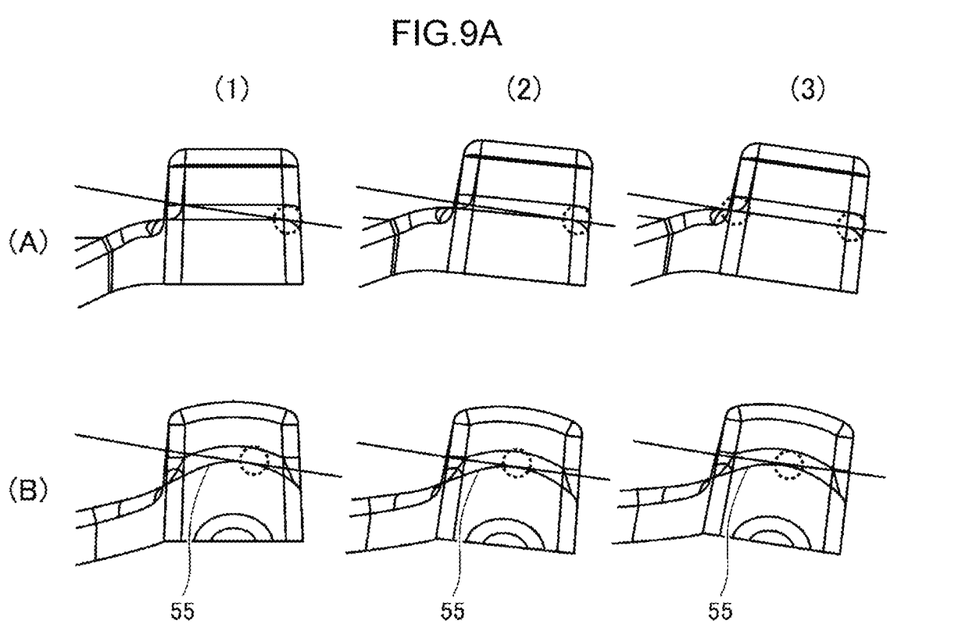
FIG. 9A is a schematic diagram illustrating the state of contact between a substrate and a substrate support portion.

FIG. 9A is a schematic diagram illustrating a state where the substrate support portion 55 is in contact with a substrate W. In FIG. 9A, the upper part (A) illustrates a conventional V-shaped substrate support portion, and the lower part (B) illustrates the substrate support portion 55 of the embodiment. In addition, the dashed line indicates the contact point with the substrate W as the displacement amount (pressed amount) is changed from 0 mm (1), 2.5 mm (2), to 3.5 mm (3).

Figure 9B:
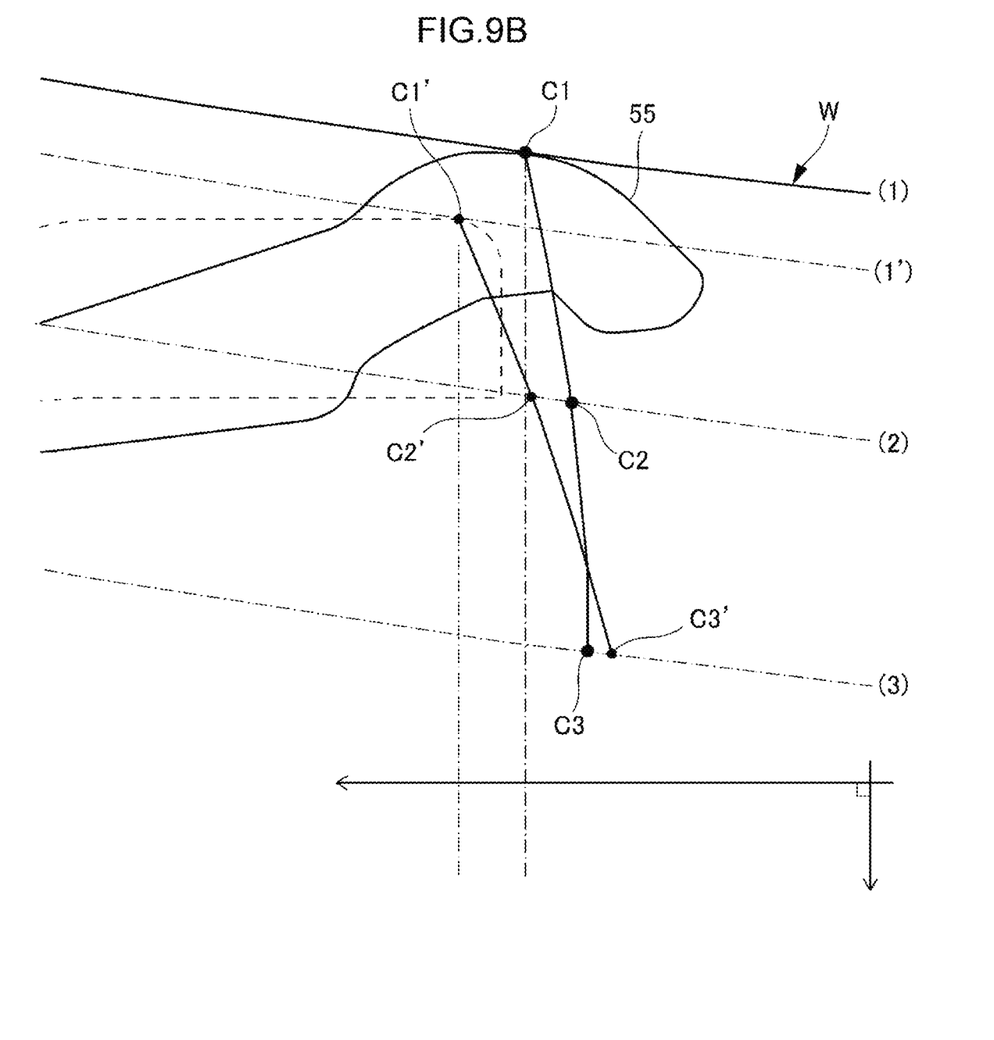
FIG. 9B is a schematic diagram illustrating the trajectory of the contact position between a substrate and the substrate support portion.

FIG. 9B is a schematic diagram illustrating the trajectory of the contact position between the substrate W and the substrate support portion 55. In FIG. 9B, the dashed line indicates the V-shaped substrate support portion of a conventional product. Additionally, the solid line (1) and the dashed-dotted lines (2) and (3) indicate the substrate W when the displacement amount (pressed amount) is changed from 0 mm, 2.5 mm, to 5.0 mm, while the dashed-dotted line (1') indicates the substrate W in contact with the substrate support portion of the conventional product when the displacement amount is 0 mm.

When the lid 20 is pushed toward the container body 10 to be closed, substrates W each come into contact with a respective pair of the left and right substrate support portions 55 of the retainer 50. As a result, each of the arms 52 is pressed by the reaction force of a corresponding one of the substrates W and begins to deform (bend). When the arms 52 are deformed to a predetermined position, the substrates W are held and retained between the supports 11 of the container body 10 and the substrate support portions 55.

The state of contact between a substrate W and the substrate support portion 55, or the trajectory of the contact position therebetween, can be represented in a drawing as illustrated in FIG. 9B. Assuming here that the contact position where the substrate W first comes into contact with the substrate support portion 55 is defined as the first contact position C1, and that the contact position where the substrate W is held by the substrate support portion 55 when the substrate support portion 55 is pressed by 2.5 mm due to the completion of the closing of the lid 20 is defined as the holding contact position C2, the difference between the first contact position C1 and the holding contact position C2 in the horizontal direction is preferably 1.0 mm or less, more preferably 0.5 mm or less. At this time, the arm 52 bends about the base located outside the substrate support portion 55 as a fulcrum, and the extending direction of the arm 52 coincides with the left-right direction perpendicular to the closing direction of the lid 20.

Incidentally, in this embodiment, the difference between the first contact position C1 and the holding contact position C2 is 0.46 mm when the substrate support portion 55 is pressed by 2.5 mm and 0.66 mm when the substrate support portion is pressed by 5.0 mm. On the other hand, in the conventional product, the difference between the first contact position C1' and the holding contact position C2' is 0.75 mm, and the difference between the first contact position C1' and the holding contact position C3' is 1.57 mm.

As illustrated in FIGS. 9A and 9B, in the case of the substrate support portion 55 of the embodiment, the contact point does not move significantly, and therefore it can be said that the substrate W is held stably. Thus, the substrate W is hardly rubbed. On the other hand, in the case of the conventional V-shaped substrate support portion, the contact point moves significantly, which means that the substrate W is not held stably. As a result, the substrate W is rubbed.

As described above, according to the embodiment, the substrate storage container 1 includes the container body 10 configured to store substrates W, the lid 20 that closes the opening of the container body 10, and the retainer 50 attached to the lid 20. The retainer 50 is provided with pairs of the left and right substrate support portions 55 configured to hold the substrates W with the container body 10 to retain the substrates W. The substrate support portions 55 each have an arc shape in a cross-sectional view from the top-to-bottom direction perpendicular to the closing direction of the lid 20.

Thus, when the container body 10 is closed with the lid 20, the arms are elastically deformed and displaced by being pressed by the reaction force of the substrates W while holding the substrates W; however, even if their displacement amounts (pressed amounts) vary or differ, the contact position (contact point) between each of the substrate support portions 55 and each substrate W is not significantly shifted. This allows each of the substrates W to be held in a stable position and with a stable holding force. In addition, since the substrates W can be held with appropriate clamping force, vibrations and shocks can be absorbed, and damage to the substrates W can be reduced.

Furthermore, the difference between the first contact position C1, where a substrate W first comes into contact with the substrate support portion 55 by the closing operation of the lid and the holding contact position C2, where the substrate W is held by the substrate support portion 55 upon completion of the closing operation of the lid 20, can be 1.0 mm or less.

According to the embodiment, the substrate support portion 55 forms a U-shaped slot with a pair of the substrate guide portions 56 erected from its upper and lower ends. This allows even a thick substrate such as a stacked substrate to be supported by the substrate support portion 55 which is larger (higher) than the thickness of the substrate W. Additionally, the substrate guide portions 56 at the upper and lower ends can prevent the substrate W from excessive vertical movement. As a result, the substrate W can be held stably.

According to the embodiment, each of the arms 52 includes the holding force adjustment portion 54 that enables the adjustment of the holding force for holding a substrate W. Thereby, the degree of freedom in designing the arms 52 can be increased, and the holding force of 0.15 N or more and 10 N or less can be obtained.

According to the embodiment, the retainer 50 is provided with the mis-attachment prevention protrusions 51A and/or identification protrusions. This allows the operator to identify the vertical direction and load specifications of the retainer 50. Thus, erroneous attachment to the lid 20 can be prevented. In addition, with the use of a robot or the like equipped with an imaging device such as a charge-coupled device (CCD) camera, an image of the lid 20 removed from the container body 10 can be captured for automatic recognition (identification) to detect erroneous attachment before substrates W are stored in the container body 10.

While preferred embodiments of the invention have been described and illustrated, it is to be understood that the invention is not limited to the embodiments disclosed herein. Various changes, modifications, and alterations may be made within the scope of the invention as defined in the appended claims.

(Modification)

Modifications in which the configuration of the retainer 50 of the above embodiment is modified will be described. Note that the various modifications may be applied independently or in combination. Note also that the reference numerals may be omitted for the same parts as those in the above embodiment.

Figure 6:
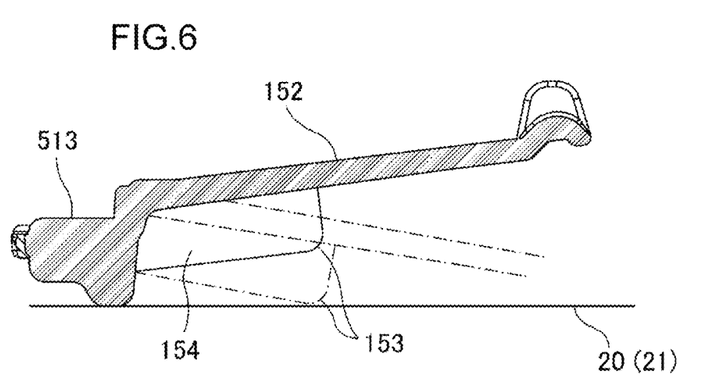
FIG. 6 is a cross-sectional view of an arm having a rib as a holding force adjustment portion.

FIG. 6 is a cross-sectional view of an arm 152 having a rib as a holding force adjustment portion 154. As illustrated in FIG. 6, the arm 152 of a modification has a rib (hereinafter also designated by the reference numeral "154") as the holding force adjustment portion 154.

The holding force may be adjusted by changing the length of the rib 154 without changing its thickness. For example, assuming that the length L of the rib 154 is changed in the range of 0.6 mm to 19 mm, and that the displacement amount X of the substrate support portion 55 that holds a substrate W is in the range of 1 mm to 4 mm, the holding force Y (N: Newton) preferably satisfies the following Formula (1):

$$0.15X \le Y \le 2.50X \qquad \text{Formula (1)}$$

In other words, the spring constant k of the arm 152 is preferably made 0.15 N/mm or more and 2.5 N/mm or less by adjusting the length L of the rib 154. In this case, also, the holding force of the arm 152 can be adjusted in the range of 0.15 N (15 gf) to 10.0 N (1020 gf).

In addition, the length L of the rib 154 is preferably changed in the range of 8 mm to 14 mm. For example, the holding force may be set to 3 N (294 gf) when the displacement amount X of the arm 152 is 2.5 mm by setting the length L of the rib 154 to 11 mm to adjust the spring constant k to 1.2 N/mm.

When the arm 152 having the rib 154 is sufficiently bent, the rib 154 comes into contact with the lid 20 as indicated by the dashed-dotted line in FIG. 6. A portion of the rib 154 that contacts the lid 20 is hereinafter referred to as a contact base portion 153.

Generally, the arm 152 is configured such that the entire body is flexed. For example, in an emergency situation where a strong impact is applied to the arm 152 during transportation or transfer of the substrate storage container 1, the contact base portion 153 comes into contact with the lid 20 (door body 21). As a result, the starting point (fulcrum) at which the arm 152 deforms shifts from the junction with the left side 513 to the contact base portion 153. This reduces the apparent length of the flexing portion of the arm 152 and allows the spring load or spring constant to be increased.

In other words, the arm 152 having the contact base portion 153 can increase the spring load or spring constant. The contact base portion 153 may be provided in a region other than the tip of the rib 154, or it may be provided separately from the rib 154. Further, the arm 152 may be provided with only the contact base portion 153 that contacts the lid 20 when the arm 152 is sufficiently flexed.

Figure 7:
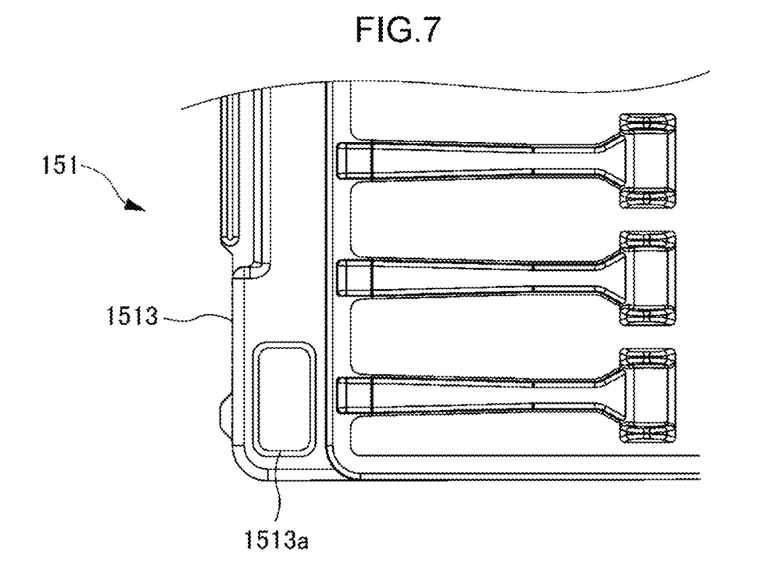
FIG. 7 is a plan view of a base frame having openings.

FIG. 7 is a plan view of a base frame 151 having a plurality of openings 1513*a*. As illustrated in FIG. 7, the base frame 151 is provided with the openings 1513*a* passing through the front and back surfaces along the entire length of a left side 1513 (although not illustrated, the same applies to the right side). The openings 1513*a* formed in this manner, together with the spacer protrusions 59 described above, allow liquid such as cleaning liquid or cleaning water to be drained so that no liquid remains when the substrate storage container 1 is cleaned.

Figure 8:
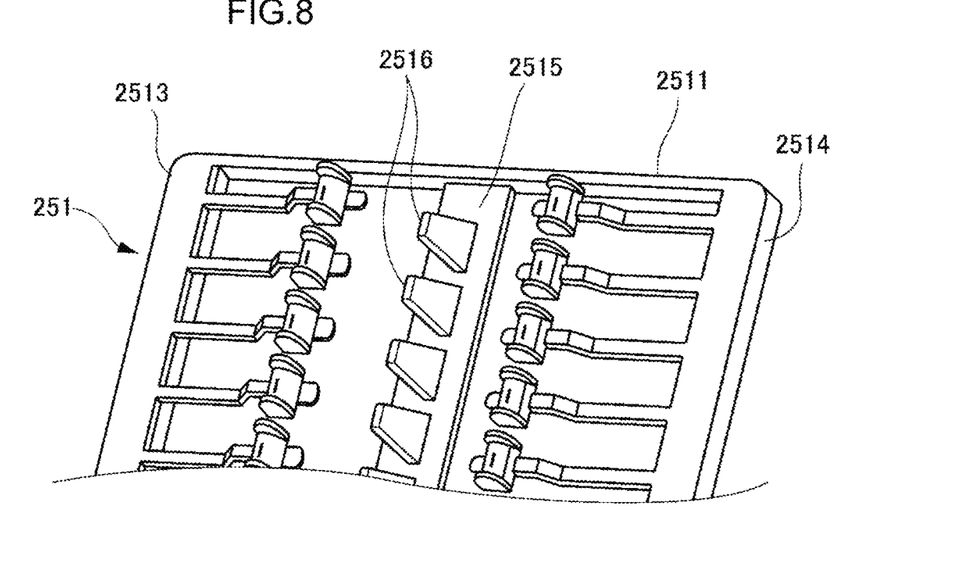
FIG. 8 is a plan view of a base frame having restricting protrusions.

FIG. 8 is a plan view of a base frame 251 having a plurality of restricting protrusions 2516. As illustrated in FIG. 8, the base frame 251 has an intermediate beam 2515 that connects an upper side 2511 and the lower side (not illustrated) between a left side 2513 and a right side 2514.

The intermediate beam 2515 is provided with the restricting protrusions 2516 that restrict the vertical movement of substrates W. Incidentally, the restricting protrusions 2516 do not necessarily have to be arranged linearly in a row as illustrated, but may be arranged, for example, in two rows in a staggered manner (see FIG. 4 of Patent Document 1).

Unlike the substrate support portions 55 provided at the tip of the elastically deformable arms 52, the restricting protrusions 2516 do not dynamically support substrates W. Each substrate W is inserted in the gap between an adjacent pair of the restricting protrusions 2516 and is fixedly (statically) held, whereby the positional deviation can be regulated. Note that the gap between the restricting protrusions 2516 is located at the same height as the slot formed by the substrate support portion 55 and the substrate guide portions 56.

The invention claimed is:

1. A substrate storage container, comprising:
a container body configured to store a substrate;
a lid that closes an opening of the container body;
a retainer that is attached to the lid; and
a pair of left and right arms formed in the retainer, each having a semi-cylindrical substrate support portion at a tip, wherein
each of the substrate support portions has a support surface that protrudes in an arc shape from the tip toward the container body in a cross-sectional view from a top-to-bottom direction perpendicular to a closing direction of the lid, and
each of the substrate support portions are configured to contact a side surface of the substrate to hold the substrate together with the container body to retain the substrate,
the arms each comprise a holding force adjustment portion formed in a shape that decreases in thickness from a proximal end to a distal end of the holding force adjustment portion.

2. The substrate storage container according to claim 1, wherein a difference between a first contact position, where the substrate first comes into contact with the substrate support portion by a closing operation of the lid, and a holding contact position, where the substrate is held by the substrate support portion upon completion of the closing operation of the lid, is 1.0 mm or less.

3. The substrate storage container according to claim 1, wherein the substrate support portion forms a U-shaped slot together with a pair of substrate guide portions erected from upper and lower ends thereof.

4. The substrate storage container according to claim 1, wherein the holding force adjustment portion of each arm enables adjustment of a holding force for holding the substrate.

5. The substrate storage container according to claim 4, wherein the holding force is 0.15 N or more and 10 N or less.

6. The substrate storage container according to claim 4, wherein
the holding force adjustment portion is configured to enable the adjustment of the holding force by a change in length of a rib in a range of 0.6 mm to 19 mm, and
the holding force satisfies the following Formula (1) when a displacement amount of the substrate support portion that holds the substrate is in a range of 1 mm to 4 mm:

$$0.15X \leq Y \leq 2.50X \qquad \text{Formula (1)}$$

where Y represents the holding force (N), and X represents the displacement amount (mm) of the substrate support portion.

7. The substrate storage container according to claim 1, wherein the arms each contact base portion that can come into contact with the lid, and a spring constant thereof changes when the contact base portion comes into contact with the lid.

8. The substrate storage container according to claim 1, wherein
the retainer comprises a base frame that is attached to the lid, and
the base frame has an opening.

9. The substrate storage container according to claim 1, wherein
the retainer comprises a base frame that is attached to the lid, and
the base frame has a restricting protrusion that restricts vertical movement of the substrate.

10. The substrate storage container according to claim 1, wherein the retainer comprises a mis-attachment prevention protrusion that enables top and bottom or specifications of the retainer to be identified when the retainer is attached to the lid.

* * * * *

UNITED STATES PATENT AND TRADEMARK OFFICE
CERTIFICATE OF CORRECTION

PATENT NO. : 12,451,384 B2  
APPLICATION NO. : 18/377053  
DATED : October 21, 2025  
INVENTOR(S) : Osamu Ogawa et al.

Page 1 of 1

It is certified that error appears in the above-identified patent and that said Letters Patent is hereby corrected as shown below:

In the Claims

Column 10, Line 51, Claim 7, delete "each" and insert -- each comprise a --

Signed and Sealed this  
Ninth Day of December, 2025

John A. Squires  
*Director of the United States Patent and Trademark Office*